US012153864B2

(12) United States Patent
Ganesan et al.

(10) Patent No.: US 12,153,864 B2
(45) Date of Patent: Nov. 26, 2024

(54) MESSAGE PASSING MULTI PROCESSOR NETWORK FOR SIMULATION VECTOR PROCESSING

(71) Applicant: Synopsys, Inc., Mountain View, CA (US)

(72) Inventors: Subramanian Ganesan, Cupertino, CA (US); Ramesh Narayanaswamy, Palo Alto, CA (US); Dinesh Madusanke Pasikku Hannadige, Dodanduwa (LK); Chanaka Ranathunga, Kuliyapitiya (LK); Aditha Pabasara Rajakaruna, Veyangoda (LK); Subha Sankar Chowdhury, Bangalore (IN)

(73) Assignee: Synopsys, Inc., Sunnyvale, CA (US)

( * ) Notice: Subject to any disclaimer, the term of this patent is extended or adjusted under 35 U.S.C. 154(b) by 520 days.

(21) Appl. No.: 17/668,184

(22) Filed: Feb. 9, 2022

(65) Prior Publication Data
US 2022/0253583 A1    Aug. 11, 2022

Related U.S. Application Data

(60) Provisional application No. 63/148,100, filed on Feb. 10, 2021.

(51) Int. Cl.
*G06F 30/331*    (2020.01)

(52) U.S. Cl.
CPC ................... *G06F 30/331* (2020.01)

(58) Field of Classification Search
CPC ...... G06F 30/20; G06F 30/33; G06F 30/3308; G06F 30/367; G06F 30/331; G06F 30/398
USPC ........................................................ 716/106
See application file for complete search history.

(56) References Cited

U.S. PATENT DOCUMENTS

| | | | | |
|---|---|---|---|---|
| 6,014,512 A | * | 1/2000 | Mohamed | G06F 30/33 703/27 |
| 8,136,065 B2 | * | 3/2012 | Huang | G06F 30/331 716/136 |
| 2003/0105617 A1 | * | 6/2003 | Cadambi | G06F 30/331 703/14 |

* cited by examiner

*Primary Examiner* — Paul Dinh
(74) *Attorney, Agent, or Firm* — Patterson + Sheridan, LLP

(57) ABSTRACT

This disclosure describes an apparatus and method for simulating circuit designs. An apparatus for simulating circuit designs includes a first simulation vector processor (SVP) and a second SVP communicatively coupled to the first SVP. The first SVP simulates a first portion of a circuit design under test. The second SVP simulates the first portion of the circuit design under test at least partially while the first SVP simulates the first portion of the circuit design and asynchronously with the first SVP and transmits data to the first SVP while simulating the first portion of the circuit design, wherein the first SVP uses the data while simulating the first portion of the circuit design.

20 Claims, 9 Drawing Sheets

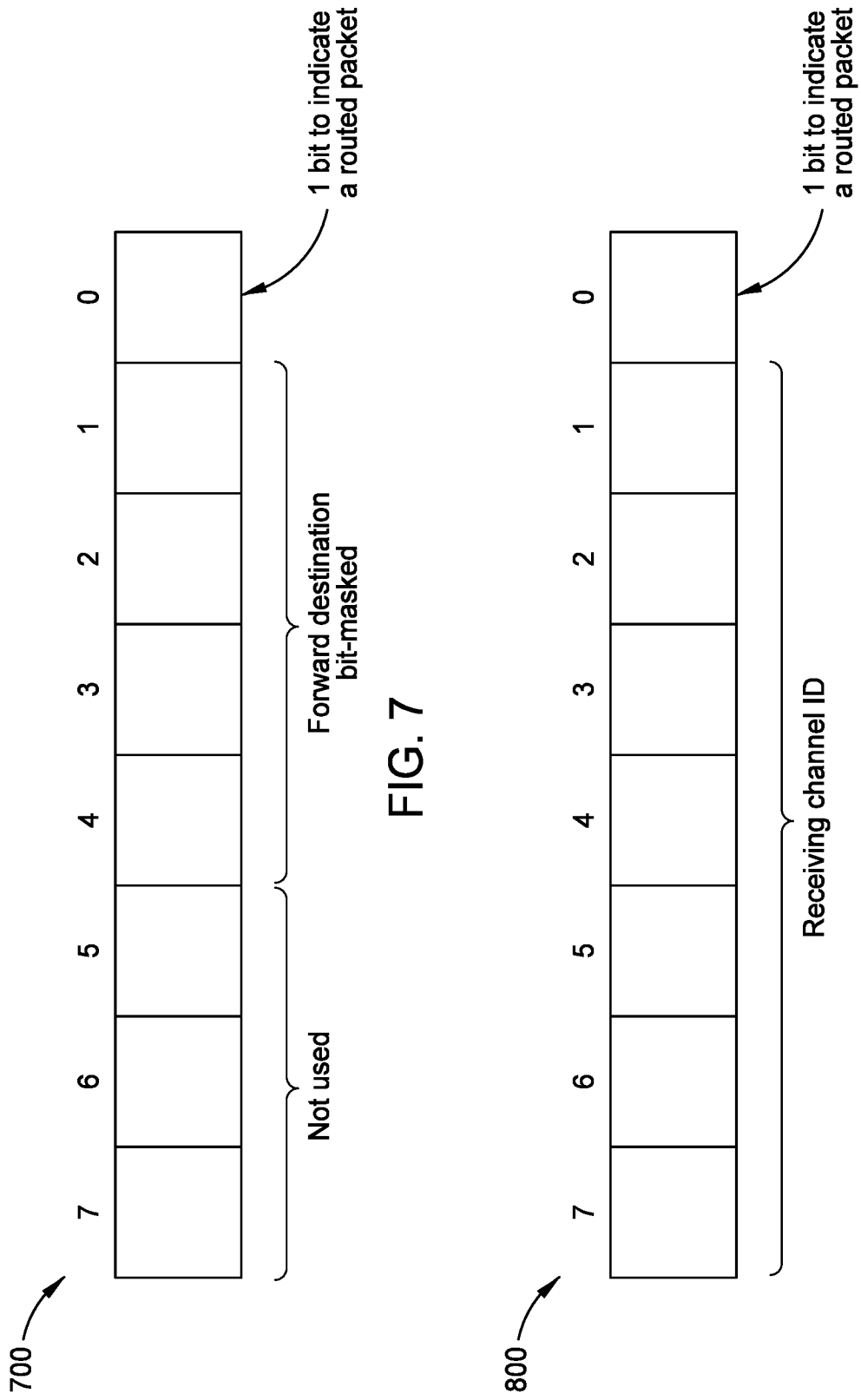

MESSAGE PASSING MULTI PROCESSOR NETWORK FOR SIMULATION VECTOR PROCESSING

CROSS-REFERENCE TO RELATED APPLICATIONS

This application claims priority to and the benefit of U.S. Provisional Patent Application Ser. No. 63/148,100, entitled "Message Passing Multi Processor Network for Simulation Vector Processing," filed Feb. 10, 2021, which is incorporated herein by reference in its entirety.

TECHNICAL FIELD

The present disclosure relates to multi-processor computing systems, and more particularly to managing data interconnect and routing in multi-processor computing systems.

BACKGROUND

Circuit designs may be tested and verified before circuit designs are sent for fabrication. During testing and verification, the circuit designs are simulated in many different operating conditions to determine whether the circuit design operates as intended.

Multi-core simulation for speeding up functional register transfer level (RTL) simulation using specialized hardware requires efficient communication between the scores or even hundreds of processing cores. Typical multi-core systems have generic interconnect and data sharing mechanisms using shared memory or standard network topology. These approaches are not suitable for functional simulation acceleration, which may need a very tight interconnect with very low latency and high bandwidth.

SUMMARY

Embodiments described herein include an apparatus and a method for simulating circuit designs. According to an embodiment, an apparatus for simulating circuit designs includes a first simulation vector processor (SVP) and a second SVP communicatively coupled to the first SVP. The first SVP simulates a first portion of a circuit design under test. The second SVP simulates the first portion of the circuit design under test at least partially while the first SVP simulates the first portion of the circuit design and asynchronously with the first SVP and transmits data to the first SVP while simulating the first portion of the circuit design, wherein the first SVP uses the data while simulating the first portion of the circuit design.

The apparatus may include a third SVP. The data is first transmitted from the second SVP to the third SVP and then transmitted from the third SVP to the first SVP. The second SVP may determine, based on a data structure stored by the second SVP, that the data should be first transmitted from the second SVP to the third SVP. The data structure may indicate a route from the second SVP to the first SVP, and the route may include the third SVP. The data may be first transmitted from the second SVP to the third SVP in response to an instruction to transmit the data from the second SVP to the first SVP. The third SVP may modify a header of a packet containing the data before transmitting the data to the first SVP.

The first SVP may include a flow processor and a vector processor communicatively coupled to the flow processor. The flow processor controls an execution flow of the vector processor. The flow processor and the vector processor may be synchronous.

The second SVP may transmit control information to the first SVP. The first SVP uses the control information to resolve a control branch.

The data may include at least one of value data used by the first SVP as input to an instruction or control information used by the first SVP to break sequential execution of an instruction flow of the first SVP.

The first SVP and the second SVP may be arranged on a same functional simulation acceleration (FSA) system board.

The first SVP may be arranged on a first FSA system board and the second SVP may be arranged on a second FSA system board. The first FSA system board and the second FSA system board are assembled on a same chassis.

According to another embodiment, a method for simulating circuit designs includes simulating, by a first simulation vector processor (SVP), a first portion of a circuit design under test and simulating, by a second SVP communicatively coupled to the first SVP, the first portion of the circuit design under test at least partially while the first SVP simulates the first portion of the circuit design and asynchronously with the first SVP. The method also includes transmitting, by the second SVP, data to the first SVP while simulating the first portion of the circuit design and using, by the first SVP, the data while simulating the first portion of the circuit design.

The data may be first transmitted from the second SVP to a third SVP and then transmitted from the third SVP to the first SVP. The method may include determining, by the second SVP and based on a data structure stored by the second SVP, that the data should be first transmitted from the second SVP to the third SVP. The data structure may indicate a route from the second SVP to the first SVP, and the route may include the third SVP. The data may be first transmitted from the second SVP to the third SVP in response to an instruction to transmit the data from the second SVP to the first SVP. The method may include modifying, by the third SVP, a header of a packet containing the data before transmitting the data to the first SVP.

The first SVP may include a flow processor and a vector processor communicatively coupled to the flow processor. The flow processor controls an execution flow of the vector processor.

The method may include transmitting, by the second SVP, control information to the first SVP and using, by the first SVP, the control information to resolve a control branch.

The data may include at least one of value data used by the first SVP as input to an instruction or control information used by the first SVP to break sequential execution of an instruction flow of the first SVP.

According to another embodiment, a non-transitory computer readable medium stores instructions that, when executed by a first SVP, cause the first SVP to perform an operation for simulating circuit designs. The operation includes simulating a first portion of a circuit design under test. A second SVP communicatively coupled to the first SVP simulates the first portion of the circuit design under test at least partially while the first SVP simulates the first portion of the circuit design and asynchronously with the first SVP. The operation also includes receiving data from the second SVP while simulating the first portion of the circuit design and using the data while simulating the first portion of the circuit design.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 7 depicts a header for routing a packet, according to certain embodiments.

FIG. 8 depicts a modified packet header, according to certain embodiments.

DETAILED DESCRIPTION

Figure 1:
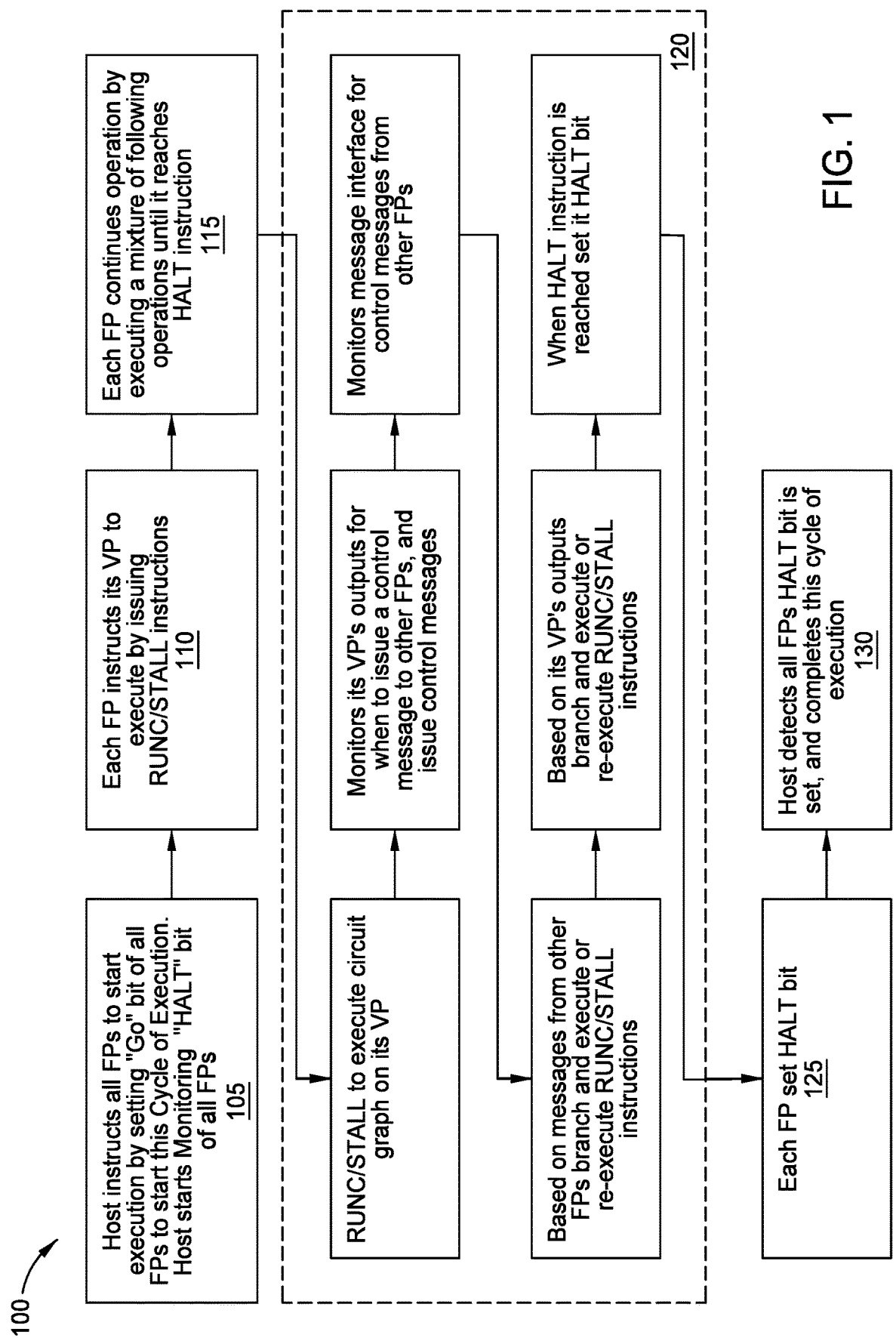
FIG. 1 depicts a flow diagram for Functional Simulation Acceleration (FSA) runtime software executing in an FSA system according to certain embodiments.

Many different simulations may be executed against a circuit design to test whether the circuit design operates as intended. Because the number of simulations may be very large, it may take a large amount of time to perform these simulations.

Multi-core simulation for speeding up functional register transfer level (RTL) simulation using specialized hardware may require efficient communication between the scores or even hundreds of processing cores. Typical multi-core systems have generic interconnect and data sharing mechanisms using shared memory or standard network topology. These approaches, however, are not suitable for functional simulation acceleration (FSA), which may need a very tight interconnect with very low latency and high bandwidth. For example, the generic interconnect and data sharing mechanisms of typical multi-core systems may be slow, which may cause different cores to stall while waiting for data or information from other cores. As a result, the typical multi-core systems introduce delays into the simulations and may not speed up the simulations as much as desired.

Aspects of the present disclosure relate to FSA systems and more specifically to message passing in a multi-processor network for simulation vector processing. Circuit designs may be simulated, tested, and verified before fabrication utilizing an FSA system implemented with domain-specific multi-core simulation vector processors (SVP) to provide orders of magnitude more performance than conventional solutions. Each SVP is a hardware processor that can be implemented in a field programmable gate array (FPGA) or a system on chip (SoC) custom application-specific integrated circuit (ASIC). Each SVP implements an instruction set with instructions that operate efficiently and effectively on vectors (e.g., one-dimensional arrays). Each SVP includes a number of evaluation units that execute these instructions in parallel. These numbers are driven by the amount of logic and memory available in the target FPGA/SoC. By executing these instructions, the FSA simulates the operation of circuits based on their circuit designs under many different operating conditions.

An FSA system board includes multiple SVPs assembled on a printed circuit board (PCB). Multiple FSA boards may be assembled in a single or the same chassis to form an FSA system that includes a large number of SVPs.

Each SVP may include a vector processor (VP) and a flow processor (FP). A VP may include multiple (e.g., hundreds of) evaluation units (EUs), each capable of executing thousands of instructions or primitives. Every VP communicates with an FP, which controls the execution flow of the VP. A compiler generates code instructing the FP what sequence of instructions is to be executed. For example, the FP may be instructed to selectively execute instructions that simulate the operation of portions of the circuit design based on signal conditions. The VP then executes the instructions according to commands from the FP. The VP and the FP may be implemented using separate hardware components in the SVP. For example, the VP may be implemented using a first hardware processor (e.g., implemented using an FPGA or SoC) and its corresponding FP may be implements using a second hardware processor (e.g., implemented using an FPGA or SoC). The first and second hardware processors may communicate with each other over one or more wires or buses. A single SVP is fully synchronous, which means that the FP and VP in the SVP run on a single FSA clock.

The EUs in a VP are co-located in a single physical device, such as an FPGA. The EUs are interconnected and can share or exchange evaluation results on every FSA clock cycle. There is a fixed latency between when the EUs generate outputs to when these outputs can be used as inputs for future instructions. This allows the compiler to schedule instructions with dependencies an appropriate number of clock cycles apart.

In some systems, VPs may be spread across multiple physical devices (e.g., FPGAs) and even multiple boards. The EUs in these VPs may not be directly interconnected. For example, it may not be practical to provide enough bandwidth for the outputs from the EUs to be distributed to the other EUs in the system or even the board.

A hierarchical interconnect is disclosed herein to address shortcomings of conventional approaches. The compiler may be unaware of the underlying hardware interconnect architecture and topology. Disclosed embodiments will also allow the FSA system to scale as more VPs are added. In this manner, the FSA speeds up functional RTL simulation more than conventional multi-core systems.

FIG. 1 depicts a flow diagram 100 for FSA runtime software executing in an FSA system according to certain embodiments.

At 105, the flow diagram 100 depicts the FSA runtime software executing in a host server as a first step downloads the images created by the FSA compiler. The runtime software will set the "GO" bit, which is part of the flow processor control register (e.g., each FP control register holds a bit that is designated as the "GO" bit for that FP). "GO" bits for the FPs in the multi-SVP system are set sequentially. By setting the "GO" bit of a FP, the FP is effectively notified that the FP has instructions that are ready for execution. When the FP determines that its "GO" bit has been set, the FP may begin executing the instructions downloaded to that FP. FSA runtime software will then start monitoring the HALT bits of the FPs in the system. The HALT bit in an FP indicates when the FP has completed execution of its instruction flow. For example, the FPs may reach HALT instructions at the end of their respective instruction flows. When an FP reaches a HALT instruction in its instruction flow, the FP sets its HALT bit to indicate to the FSA runtime software and to other FPs that the FP has completed execution of its instruction flow.

At 110, each FP in the system that has the GO bit set will start executing the instruction flow that was downloaded to the FP. The first instruction in each instruction flow will typically be an ALLDONE instruction discussed in greater detail below. The ALLDONE instruction will synchronize the execution of the FPs in the system. For example, the FPs may pause at their ALLDONE instructions and wait to continue execution of their respective instruction flows until each FP is waiting at its respective ALLDONE instruction. This provides the flexibility to the FSA runtime software to set the GO bits of the different FPs in any order. RUNC and STALL instructions are dispatched from the FPs to their respective and connected VPs.

At 115, each FP continues execution by issuing instructions in the instruction flow until the FP reaches a HALT instruction. An example execution of an FP is shown in 120, the actions of which are enclosed in a dashed line. As seen in FIG. 1, the FP issues RUNC and STALL instructions to its VP to simulate or execute the circuit design or circuit graph. The FP monitors the output of the VP to determine whether data (e.g., value data or control data/information) should be communicated to other FPs. Value data may be used by the other FPs as input into other instructions (e.g., other RUNC instructions). Control data/information may be used by other FPs break the sequential execution of their respective instruction flows (e.g., by jumping to another portion of the instruction flow). The FP also monitors an interface to see if other FPs have communicated data (e.g., value data or control data/information) to the FP. The FP then continue executing its instruction flow based on the data received from other FPs (if any) and the output of its VP. When the FP reaches a HALT instruction in the instruction flow, the FP determines that it has completed execution of its instruction flow and waits for the other FPs to reach their respective HALT instructions.

At 125, each FP has reached its respective HALT instruction and sets its respective HALT bit (e.g., a bit in the FP's control register designated as the HALT bit). At 130, the FSA runtime detects that the FPs have reached HALT by inspecting the HALT bits of the FPs. The FSA runtime will then finish execution of the current simulation cycle. Control may be returned to the testbench. Code that applies stimulus to the design under test (DUT) may be executed, and the results of the DUT may be checked.

Figure 2:
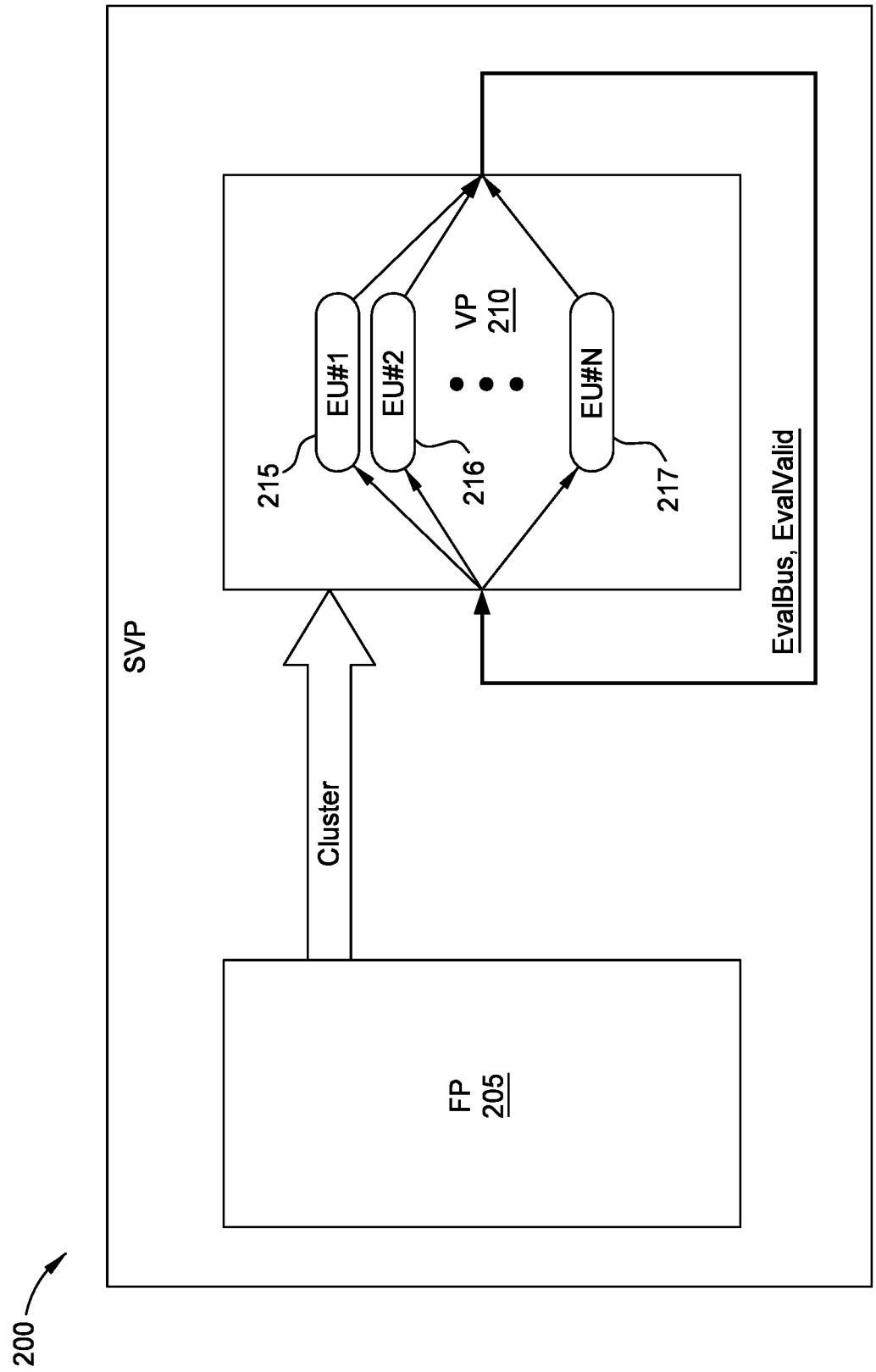
FIG. 2 depicts a simulation vector processor (SVP), according to certain embodiments.

FIG. 2 depicts a simulation vector processor (SVP) 200, according to certain embodiments.

The SVP 200 includes FP 205 and VP 210. VP 210 includes EUs such as EU #1 215, EU #2 216, to EU #N 217. An EU in this context includes primitive functions such as AND/OR/XOR/FLOP hardware functions. A compiler can pick which primitive is executed in a given EU in each cycle. In some embodiments, there may be 192 EUs, and the number of EUs may vary according to different embodiments.

The FP 205 executes microcode instructions generated by a compiler (not shown).

An example instruction flow for a single SVP 200 scenario according to certain embodiments is shown below.
Instruction 1) RUNC 0, 10
Instruction 2) STALL 20
Instruction 3) RUNC 11, 150
Instruction 4) @ICM 0, 1, 2
Instruction 5) @OGM 99, 100
Instruction 6) HALT Instruction 1 (RUNC 0, 10) evaluates the primitives in locations 0-10 in each of the EUs 1-N and exchanges the values produced by these EUs after every cycle, as discussed below in connection with FIG. 3. Similarly, Instruction 3 (RUNC 11, 150) evaluates the primitives in locations 11-150 in each of the EUs 1-N and exchanges the values produced by these EUs after every cycle.

Instruction 2 (STALL) will stall the VP for 20 cycles to flush the EvalBus pipe, which, is a bus that holds and communicates the output of the VP. According to certain embodiments, a STALL may be issued to ensure that the output value generated in the previous RUNC has time to propagate to value memory and is ready for the next RUNC or other commands to use. The value memory is a memory of the FP that stores value data from the VP. The value data may include the results of executing instructions (e.g., RUNC instructions) in the VP. Additionally, the value memory may store value data communicated from other FPs and VPs. The stored value data may then be used by the FP and VP as inputs to subsequent instructions (e.g., subsequent RUNC instructions) in the instruction flow.

Instruction 4 will distribute the values from the Testbench to the EUs operands, and Instruction 5 will take the values from EvalBus and propagate those to the Testbench.

Because this is a single SVP system, the values produced by the 192 EUs in this VP are connected back as inputs to be used by the EUs in a future cycle.

In some embodiments, special instructions may not be needed for data sharing amongst the EUs.

Figure 3:
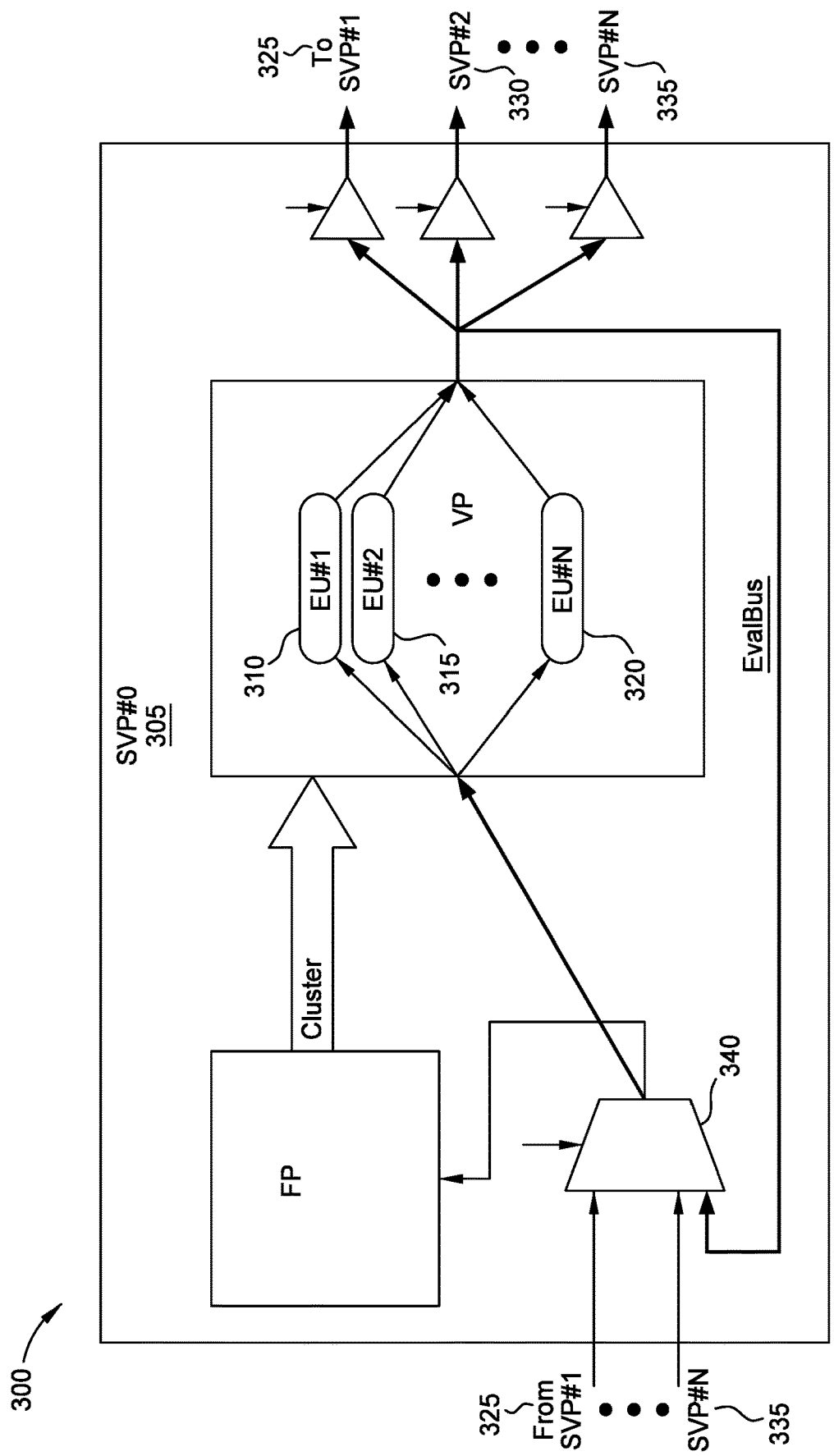
FIG. 3 depicts a system comprising multiple SVP's, according to certain embodiments.

FIG. 3 depicts a system 300 that includes multiple SVPs, according to certain embodiments. In the system 300, an SVP may be coupled to other SVPs in the FSA system.

As shown in FIG. 3, the output of an SVP #0 305 may be coupled to any number of other SVPs in the FSA system. Generally, each SVP (e.g., SVP #0 305) of the system may share the output generated by one or more of its EUs (e.g., EU #1 310, EU #2 315, to EU #N 320) in each cycle with other SVPs in the system (e.g., SVP #1 325, SVP #2 330, to SVP #N 335). The SVP #0 305, SVP #1 325, to SVP #N 335 may be like SVP 200 of FIG. 2. They can, in turn, either use the data generated by their local EUs or the data from other SVPs as inputs for evaluating EU primitives in some future cycle.

The SVPs use special message passing instructions to share data and control information with other SVPs. Shown below is an example instruction flow that includes the additional TX/RX messages to exchange data with other SVPs.

RUNC 0, 100—EUs execute logic primitives in clusters 0 to 100
    @TXDATA 90, 1, 2—transmit output from EUs in cluster 90 to SVP #1 and SVP #2
    @TXDATA 92, 1—transmit output from EUs in cluster 92 to SVP #1
    CTRL_TX R1, 1, 3—send control message from FP (in R1) to SVP #1 and SVP #3
    ALLDONE—Wait for ALLDONE messages from other SVPs
    RUNC 101, 234—EUs execute logic primitives in cluster 101 to 234
    @RXDATA 110, 3—receive data from SVP #3 for cluster 110
    CTRL_RX R2, 1—Wait for control message from SVP #1
    HALT A cluster number (e.g., cluster 90 or cluster 92) refers to particular instructions executed by the EUs of the VP. These instructions are driven by the FP across a bus to the VP. Thus, in the above example, @TXDATA 90, 1, 2 transmits the results of executing the instruction(s) identified by "cluster 90" to SVP #1 and SVP #2. Additionally, @TXDATA 92, 1 transmits the results of executing the instruction(s) identified by "cluster 92" to SVP #1.

A control message may include a binary value stored in a general purpose register (e.g., R1). The control message may be sent to other FPs so that the FPs may use these binary values to determine whether to break the sequential execution of their respective instruction flows.

There are two instructions that enable data exchange between the EUs of different SVPs:

@TXDATA will transmit the data generated by the EUs in the given cluster to the identified SVPs. Data generated in a single cluster can be multicast to more than one SVP. The hardware provides end-to-end flow control mechanism. The instruction will stall if the transmission queue (e.g., a first in first out (FIFO) queue) to one or more of the destination SVPs is full and cannot receive any more packets.

@RXDATA will attempt to receive data on the specified cluster/SVP and save it in the value memory for the local EUs to use in a future cycle. If the data has not yet arrived from the given SVP (e.g., receive queue is empty), then the instruction stalls until the queue has the data.

This ability to dynamically stall for TX/RX packets allows the FSA system to have arbitrary latency between SVPs. This capability in the hardware allows the FSA compiler to not have to precisely schedule these messages.

Because the message passing mechanism "synchronizes," there may not be a globally synchronous clock. Different SVPs can run asynchronously (e.g., on different clocks or different clock networks). This aspect of the FSA architecture allows for building FSA systems with a large number of SVPs.

Additionally, as seen in FIG. 3, each SVP may receive output or information shared by other SVPs in the system. For example, SVP #0 305 includes a multiplexer 340 that receives the outputs of the EU #1 310, EU #2 315, to EU #N 320 over the EvalBus and the outputs from SVP #1 325 to SVP #N 335. The multiplexer is then controlled to send one of these inputs to the FP. The VP may then use this output or information in future cycles.

Figure 4:
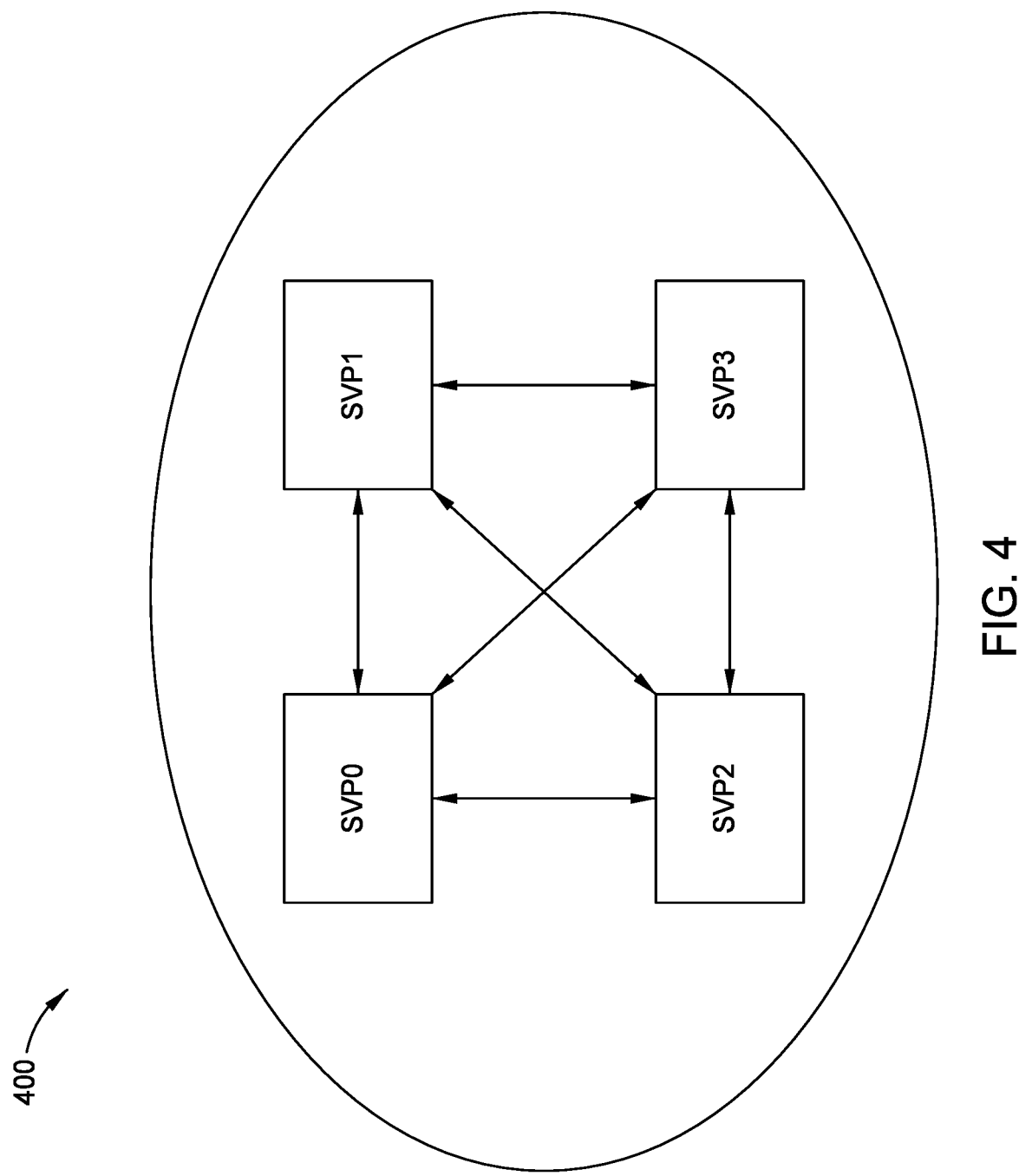
FIG. 4 depicts a multi-SVP group according to certain embodiments.

FIG. 4 depicts a multi-SVP group 400 according to certain embodiments. The FSA message-passing approach discussed above provides the benefit of supporting hierarchical interconnect between SVPs. Multi-SVP group 400 includes four connected SVPs (SVP0, SVP1, SVP2, and SVP3), and there may be a direct physical connection between any two SVPs of the group. For example, there may be physical connections between the hardware components that implement the SVPs.

In the example of FIG. 4, SVP0 has direct physical connections with SV1, SVP2, and SVP3. SVP1 has direct physical connections with SV0, SV2, and SVP3. SVP2 has direct physical connections with SVP0, SVP1, and SVP3. SVP3 has direct physical connections with SVP0, SVP1, and SVP2. Stated differently, each of the SVPs may share its output or information directly with any of the other SVPs (e.g., without sending the output or information first with an intermediate SVP or node).

Figure 5:
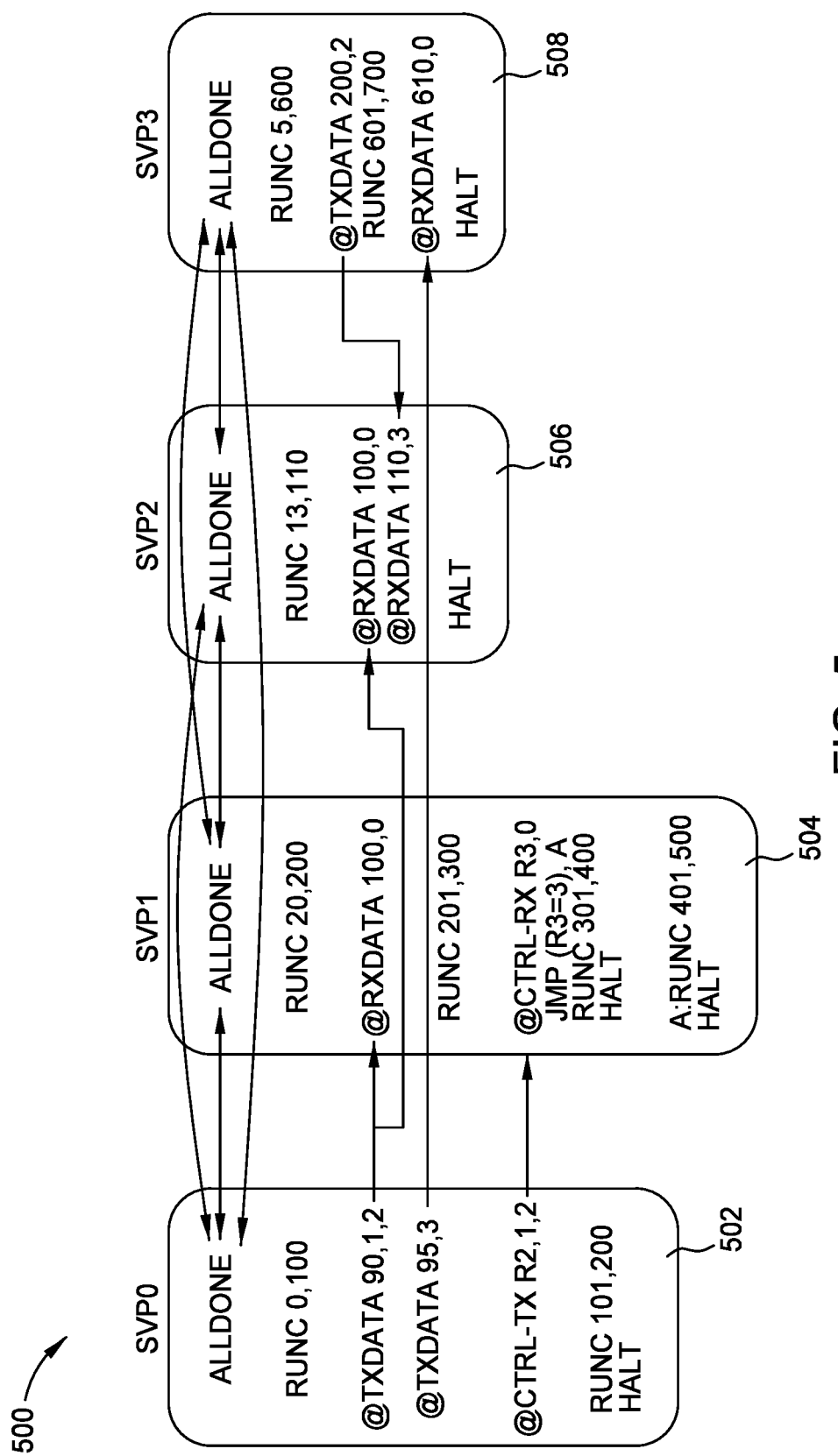
FIG. 5 depicts an instruction flow for a multi-SVP group according to certain embodiments.

FIG. 5 depicts an instruction flow 500 for a multi-SVP group according to certain embodiments. In some embodiments, the multi-SVP group for which the instruction flow 500 is provided may be similar to the multi-SVP group 400 of FIG. 4.

As seen in FIG. 5, the instruction flow 500 includes separate instruction flows 502, 504, 506, and 508 for SVP0, SVP1, SVP2, and SVP3, respectively. Each of the flows 502, 504, 506, and 508 begin with an ALLDONE instruction to synchronize the SVPs. Additional detail about the ALLDONE instruction is provided below. Furthermore, each of the flows 502, 504, 506, and 508 end when a HALT instruction is reached. As discussed previously, each of the SVPs may wait until the other SVPs have reached their respective HALT instructions. In this manner, the SVPs may simulate a portion of a circuit design at the same time but asynchronously. In other words, once all the SVPs have reached their respective ALLDONE instructions, the SVPs begin executing their respective instruction flows. Some SVPs may finish their instruction flows (e.g., reach their HALT instruction) before the other SVPs. After reaching a HALT instruction, an SVP will wait until the other SVPs have finished their respective simulation cycles (e.g., reached their HALT instructions) before starting a new simulation cycle.

Additionally, the SVPs may send and receive different types of data with each other. This data may then be used in the different instruction flows. For example, the SVPs may communicate value data using the @TXDATA and @RXDATA commands. The value data may represent the results of executing certain instructions (e.g., RUNC commands) during the simulation cycle. The value data may be communicated to another SVP, and that SVP may use that data as an input when executing another instruction (e.g., a RUNC command). As another example, the SVPs may communicate control information or control data using @CTRL-TX and @CTRL-RX commands. The control information is used by a receiving SVP to control an order of instruction execution. For example, the control information may be evaluated to determine whether the receiving SVP should jump to another portion of its instruction flow or whether the receiving SVP should continue sequentially through the instruction flow. Thus, the control information may be used by a receiving SVP to break the sequential execution of its instruction flow.

For SVP0, the instruction flow 502 includes:
RUNC 0, 100
@TXDATA 90, 1, 2
@TXDATA 95, 3
@CTRL-TX R2, 1, 2
RUNC 101, 200
HALT When @TXDATA 90, 1, 2 is executed, SVP0 sends data to SVP1 and SVP2 as instructed. When @TXDATA 95, 3 is executed, SVP0 sends data to SVP3 as instructed. When @CTRL-TX R2, 1, 2 is executed, SVP0 sends control information to SVP1 and SVP2. However, because the instruction flow 506 for SVP2 does not include a corresponding @CTRL-RX instruction, the control information from SVP0 is not received at SVP2 or used by SVP2.

For SVP1, the instruction flow 504 includes:
RUNC 20, 200
@RXDATA 100, 0
RUNC 201, 300
@CTRL-RX R3, 0
JMP (R3=3), A
RUNC 301, 400
HALT
A: RUNC 401, 500
HALT When @RXDATA 100, 0 is executed, SVP1 receives data from SVP0. When @CTRL-RX R3, 0 is executed, SVP1 receives control information from SVP0. The control information is used to resolve a control branch (JMP (R3=3), A) and to determine which branch of the instruction flow 504 (e.g., RUNC 301, 400 or RUNC 401, 500) should be executed. In the example of FIG. 5, SVP1 receives the control information from SVP0 and stores that control information into a register (R3). The control information may include a numerical value. When SVP1 reaches JMP (R3=3), A, SVP1 retrieves the control information from R3 and determines whether the numerical value equals 3. If the received control information equals 3, then SVP1 follows the JMP command to the label A and executes RUNC 401, 500 and reaches a HALT instruction. Otherwise, SVP1 continues to the next instruction and executes RUNC 301, 400 and reaches a HALT instruction. Thus, as seen in this example, SVP1 uses the control information to determine whether to break sequential execution of the instruction flow. Specifically, if the numerical value in the control information equals 3, then SVP1 breaks sequential execution and jumps to another portion of the instruction flow.

For SVP2, the instruction flow 506 includes:
RUNC 13, 110
@RXDATA 100, 0
@RXDATA 110, 3
HALT When @RXDATA 100, 0 is executed, SVP2 receives data from SVP0. When @RXDATA 110, 3 is executed, SVP2 receives data from SVP 3.

For SVP3, the instruction flow 508 includes:
RUNC 5, 600
@TXDATA 200, 2
RUNC 601, 700
@RXDATA 610, 0
HALT When @TXDATA 200, 2 is executed, SVP3 sends data to SVP2. When @RXDATA 610, 0 is executed, SVP3 receives data from SVP0.

In addition to the TX/RX instructions discussed above that facilitate the exchange of data/control information between SVPs, there are two more instructions according to certain embodiments: ALLREDUCE and ALLDONE.

ALLDONE instruction: This instruction will synchronize the FP of a first SVP group with FPs in other SVP groups in the system. The foreign FPs intended to sync should have the ALLDONE instruction at respective points in their instruction flows. Each FP will pause execution at its respective ALLDONE instruction to wait for the other FPs to reach and pause at their respective ALLDONE instructions. The instruction will send out the ALLDONE control word (e.g., 32'hFFFF_FFFF) to the other FPs when the FP reaches the ALLDONE instruction to indicate to the other FPs that the FP is ready to continue execution. After sending the ALLDONE control word, the FP will wait to receive the same ALLDONE control word from the other FPs. Once the FP receives the control word from the other FPs, it will discard the received ALLDONE control word and continue execution of the next instruction. The ALLDONE instruction has two timeout stages. One for transmitting the ALLDONE control word and the other stage for receiving the ALLDONE control word from the other FPs. Either stage can timeout and generate allDoneTx_error (e.g., indicating a timeout during the first stage) and allDoneRx_error (e.g., indicating a timeout during the second stage). In some embodiments, the FP transmits the ALLDONE control word over a channel to the other FPs. The FP also receives the ALLDONE control word from the other FPs over that channel.

ALLREDUCE instruction: This instruction will synchronize selected FPs in the system and determine the next execution region as a collective decision of the selected FPs. In this context, ALLREDUCE applies a decision expression to values produced in selected FPs. The decision expression may be a logical AND of the FP states "No More Messages." In the case of AND decision expression, if the FPs have "No More Messages" as TRUE, the result of ALLREDUCE will be TRUE. Any decision expression such as and, or, minimum, maximum, etc. can be applied to a simulation state of the FPs. Each FP selected under the instruction will make its own decision to continue to simulate the next region of a circuit design or re-simulate the current region of the circuit design. Each FP will transmit this decision to other FPs, and it will receive the same decisions from other selected FPs. If the FPs are ready to continue to the next region of the circuit design, then the FPs will start to execute or simulate the next region of the circuit design. If there is any FP that is not ready to continue and needs to re-simulate or execute the current region of the circuit design, then the selected FPs in the system will re-simulate or execute through the current region of the circuit design.

Figure 6:
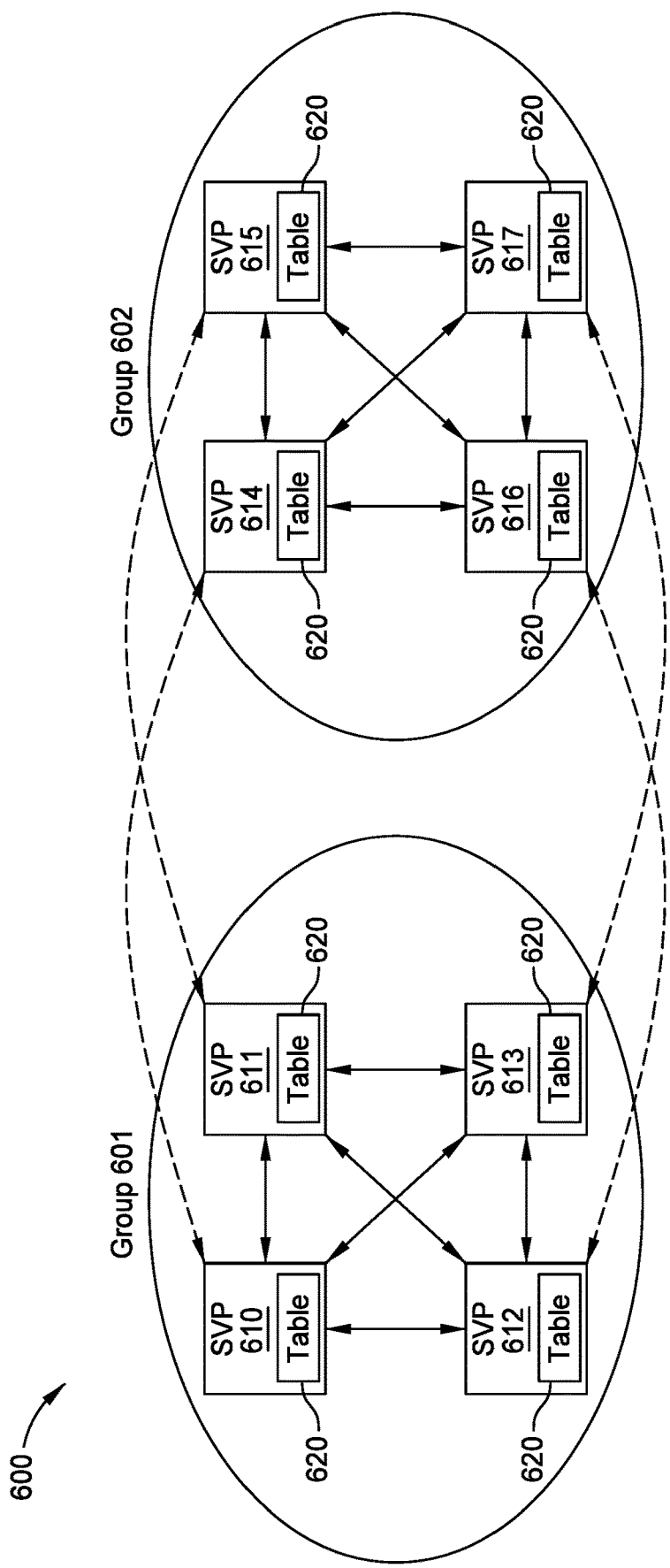
FIG. 6 depicts a multi-group FSA system, according to certain embodiments.

FIG. 6 depicts an example multi-group FSA system 600, according to certain embodiments. In the multi-group FSA system 600, the SVPs do not have direct connections (e.g., a direct physical connection) to every other SVP. It is understood that the depicted embodiment is an example and that other groups and SVP connection configurations are contemplated (e.g., fully connected). In certain embodiments, the complexity of the physical network is reduced by not having a direct connection between every SVP.

As seen in FIG. 6, SVP 610 has direct connections to SVPs 611, 612, and 613 in Group 601 and to SVP 614 in Group 602. SVP 611 has direct connections to SVPs 610, 612, and 613 in Group 601 and to SVP 615 in Group 602. SVP 612 has direct connections to SVPs 610, 611, and 613 in Group 601 and to SVP 616 in Group 602. SVP 613 has direct connections to SVPs 610, 611, and 612 in Group 601 and to SVP 617 in Group 602. SVP 614 has direct connections to SVPs 615, 616, and 617 in Group 602 and to SVP 610 in Group 601. SVP 615 has direct connections to SVPs 614, 616, and 617 in Group 602 and to SVP 611 in Group 601. SVP 616 has direct connections to SVPs 614, 615, and 617 in Group 602 and to SVP 612 in Group 601. SVP 617 has direct connections to SVPs 614, 615, and 616 in Group 602 and to SVP 613 in Group 601.

Each of the SVPs in the system 600, does not have a direct connection to every other SVP in the system 600. Thus, intermediate SVPs may be used to communicate data or information between SVPs that do not have a direct connection between them. For example, SVP 610 does not have a direct connection to SVPs 615, 616, and 617 in Group 602. Thus, if SVP 610 needs to send data or information to SVP 615, it would send the data or information to SVP 615 over one or more intermediate nodes (e.g., SVP 614). This may cause the data or information to go from SVP 610 to SVP 614 and then to SVP 615.

The physical interconnect topology is transparent to the FSA compiler. The FSA compiler will instruct that packets be sent/received by specifying the SVP ID in the TX/RX instructions. If a compiler needs to send a message between two SVPs, for example, SVP P and SVP Q, it can use the message instruction (e.g., @TXDATA) in SVP P to send a message to SVP Q. In SVP Q, the compiler can use a message instruction (e.g., @RXDATA) to receive the message from SVP P. This SVP P→SVP Q message is generated at the logical interconnect/interconnect level that in certain embodiments is logically separate from a physical level/physical interconnect. At the physical level or physical interconnect, SVP P and SVP Q may be on different boards or chassis with no direct connection between them. The hardware implementation converts the logical message (e.g., SVP P→SVP Q) to physical messages (e.g., SVP P→intermediate SVP; intermediate SVP→SVP Q) that may go from SVP P to intermediate router(s) (e.g., an intermediate SVP) and then to SVP Q. As discussed below, the route involving the intermediate SVP may be determined using a data structure referred to as a fixed connection table.

FSA hardware and firmware will deliver the packet using the links that are available. This is accomplished by routing the packets through other SVPs as needed. Routing will be done using a data structure such as a fixed connection table 620. Each VP will know their connected neighbors, but these neighbors might not be directly connected to the source VP. In that case, the data is routed through the connected physical links with hops as needed. But this routing is transparent to the software layer (e.g., the compiler). For the software layer, it will appear as if every VP is directly connected to every other VP.

As seen in FIG. 6, each SVP maintains a copy of the fixed connection table 620, which provides a routing map of the system 600 and indicates a route between any two SVPs in the system. For example, the fixed connection table 620 may include a listing of every direct connection between two SVPs in the system 600. As another example, the fixed connection table 620 may identify the next SVP in the route for every pair of SVPs and destination SVPs. Using the previous example, the fixed connection table 620 may indicate that the next SVP in the route from SVP 611 to SVP 614 is SVP 615. If SVP 611 receives data or information that needs to be routed to SVP 614, SVP 611 may determine from the fixed connection table 620 that the data or information should be routed to SVP 615. SVP 611 then routes the data or information to SVP 615. SVP 615 receives the data or information and either knows that SVP 614 is directly connected to SVP 615 or determines from its copy of the fixed connection table 620 that SVP 614 is directly connected. SVP 615 then routes the data or information to SVP 614. Each SVP or VP may use its copy of the fixed connection table 620 to determine how to route data or information from the SVP or VP.

The SVPs use a header in data or information to indicate the routing for the data or information. The format of the header 700 is shown in FIG. 7. The size of the header is 8 bits in certain embodiments. The first bit of the header (bit 0) indicates whether the data packet has to be forwarded or not. The next four bits (bits 1-4) form a bit-mask for a forwarding destination. In the example, four SVPs are supported at the other side of the intermediate node, but this may be extended as needed using additional bits in the header. Thus, each bit of these four bits (bits 1-4) indicate a SVP to which the data packet should be forwarded. If the data packet is being sent directly to a SVP (i.e., no intermediate SVP), then the first bit (bit 0) indicates that the data packet does not need to be forwarded and the four bits (bits 1-4) are not used.

The intermediate SVP will modify the packet header in accordance with FIG. 8, so that the destination SVP that ultimately receives the data packet can identify which SVP originally sent the data packet. In the example of FIG. 8, each SVP is logically connected to every other SVP even though they may not be connected physically. These logical links between the SVPs are identified using numbers that are referred to as receiving channel IDs, which can be expressed using seven bits. When the intermediate SVP receives the data packet, the intermediate SVP modifies the header so that the seven bits (bits 1-7) after the first bit (bit 0) are changed to be the receiving channel ID of the originating SVP from the perspective of the destination SVP. When the destination SVP receives the data packet from the intermediate SVP, the destination SVP may look at the seven bits (bits 1-7) to determine the identity of the originating SVP that sent the data packet. In this number, the routing mechanism for the data packet is abstracted such that all the SVPs appear interconnected.

It is understood that the FSA message passing architecture does not depend on any particular physical implementation for the links. These could be implemented as a parallel bus structure using many signals or using multi-gigabit serial links that are readily available in commercial FPGAs or other implementations understood by one of skill in the art.

Figure 9:
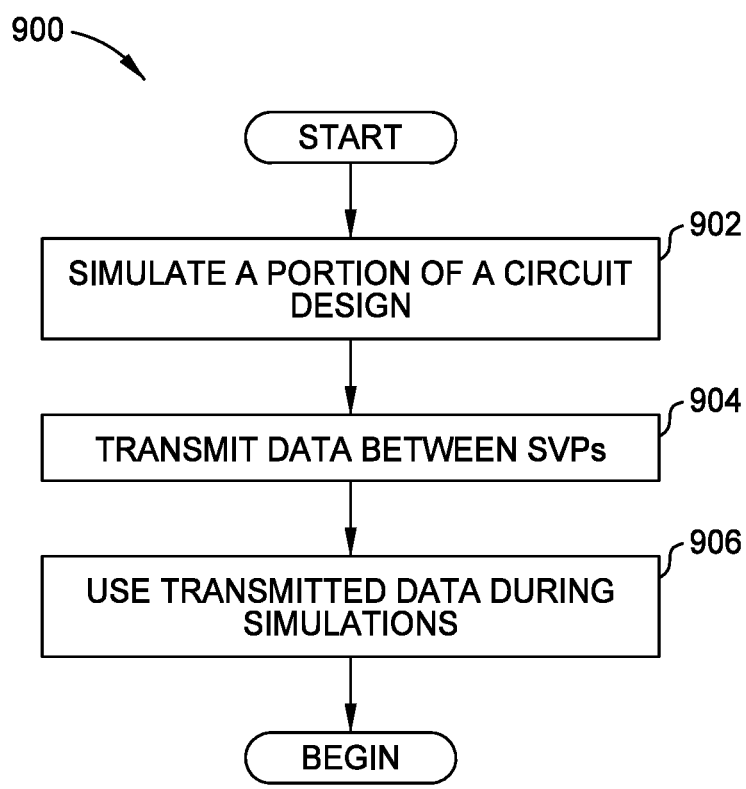
FIG. 9 is a flowchart of an example method, according to certain embodiments.

FIG. 9 is a flowchart of an example method, according to certain embodiments. In particular embodiments, SVPs in a FSA system perform the method 900. By performing the method 900, the SVPs simulate a digital circuit design while communicating data between the SVPs.

In 902, the FSA system simulates a portion of the circuit design. The FSA system may use multiple SVPs to simulate the portion of the circuit design. There may be a direct physical connection between these SVPs or the SVPs may be connected through one or more intermediary SVPs. The SVPs may simulate the same or different portions of the circuit design simultaneously and asynchronously (e.g., the SVPs may simulate their respective portions of the circuit design using independent clocks).

In 904, a first SVP transmits data to a second SVP in the FSA system. The first SVP may have generated the data while simulating its portion of the circuit design. The data may include information about an input or output in the circuit design. The data may include control information that affects the execution flow of another SVP. The first SVP may transmit the data in response to a command to transmit the data (e.g., an @TXDATA command or a CTRL-TX command). The second SVP may receive the data from the first SVP. The second SVP may receive the data in response to a command to receive the data (e.g., an @RXDATA command or a CTRL-RX command). After receiving the data, the second SVP uses the data while simulating its respective portion of the circuit design in 906. For example, the second SVP may use that data when performing other instructions or when deciding execution flow.

Figure 10:
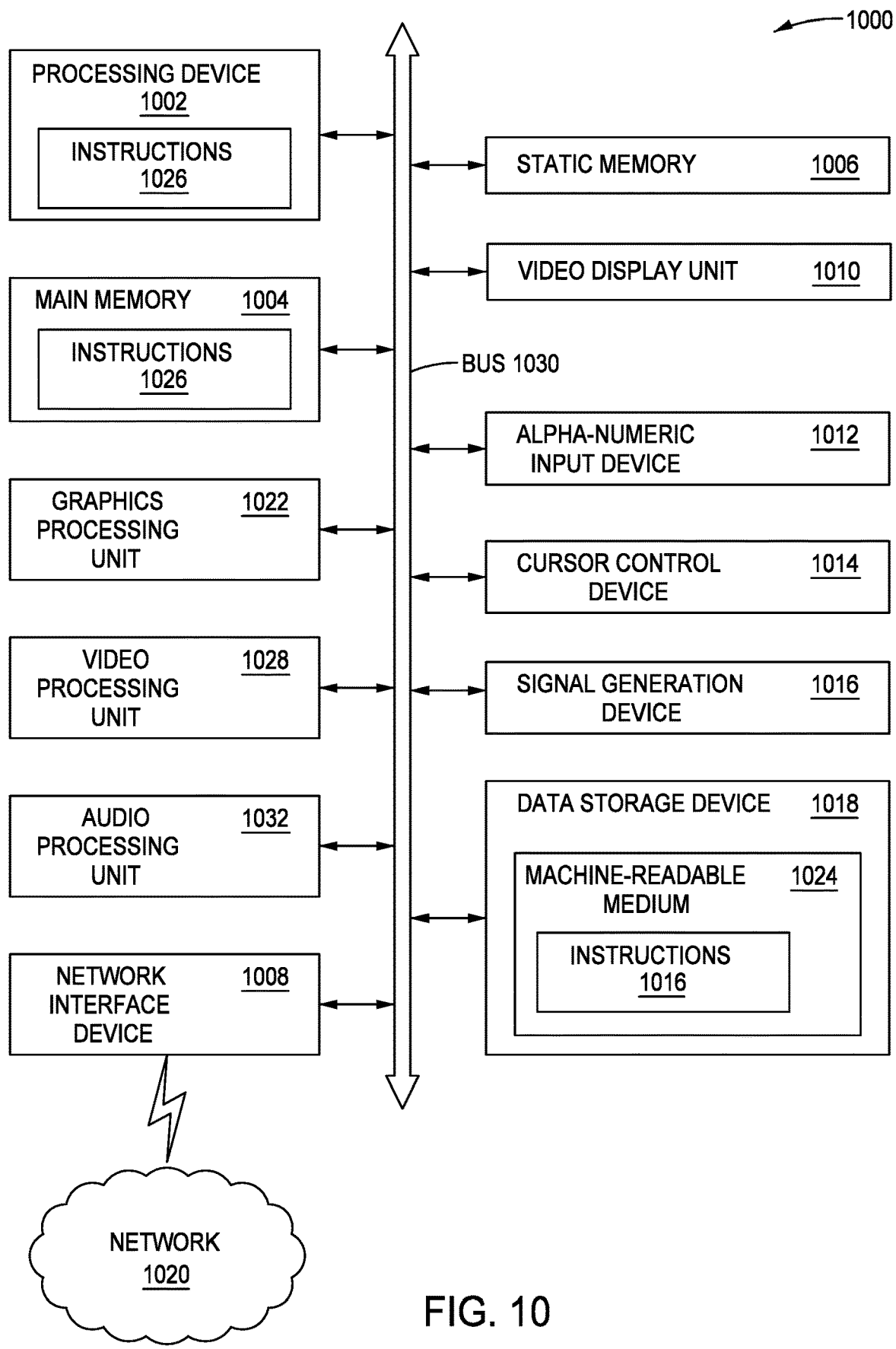
FIG. 10 depicts a diagram of an example computer system in which embodiments of the present disclosure may operate, according to certain embodiments.

FIG. 10 illustrates an example machine of a computer system 1000 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in a client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM), a static memory 1006 (e.g., flash memory, static random access memory (SRAM), etc.), and a data storage device 1018, which communicate with each other via a bus 1030.

Processing device 1002 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. The processing device 1002 may be configured to execute instructions 1026 for performing the operations and steps described herein.

The computer system 1000 may further include a network interface device 1008 to communicate over the network 1020. The computer system 1000 also may include a video display unit 1010 (e.g., a liquid crystal display (LCD) or a cathode ray tube (CRT)), an alphanumeric input device 1012 (e.g., a keyboard), a cursor control device 1014 (e.g., a mouse), a graphics processing unit 1022, a signal generation device 1016 (e.g., a speaker), graphics processing unit 1022, video processing unit 1028, and audio processing unit 1032.

The data storage device 1018 may include a machine-readable storage medium 1024 (also known as a non-transitory computer-readable medium) on which is stored one or more sets of instructions 1026 or software embodying any one or more of the methodologies or functions described herein. The instructions 1026 may also reside, completely or at least partially, within the main memory 1004 and/or within the processing device 1002 during execution thereof by the computer system 1000, the main memory 1004 and the processing device 1002 also constituting machine-readable storage media.

In some implementations, the instructions 1026 include instructions to implement functionality corresponding to the present disclosure. While the machine-readable storage medium 1024 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1002 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. An apparatus for simulating circuit designs, the apparatus comprising:
a first simulation vector processor (SVP) configured to simulate a first portion of a circuit design under test; and
a second SVP communicatively coupled to the first SVP, wherein the second SVP is configured to:
simulate the first portion of the circuit design under test at least partially while the first SVP simulates the first portion of the circuit design and asynchronously with the first SVP; and
transmit data to the first SVP while simulating the first portion of the circuit design, wherein the first SVP uses the data while simulating the first portion of the circuit design.

2. The apparatus of claim 1, further comprising a third SVP, wherein the data is first transmitted from the second SVP to the third SVP and then transmitted from the third SVP to the first SVP.

3. The apparatus of claim 2, wherein the second SVP is further configured to determine, based on a data structure stored by the second SVP, that the data should be first transmitted from the second SVP to the third SVP, wherein the data structure indicates a route from the second SVP to the first SVP, and wherein the route comprises the third SVP.

4. The apparatus of claim 2, wherein the data is first transmitted from the second SVP to the third SVP in response to an instruction to transmit the data from the second SVP to the first SVP.

5. The apparatus of claim 2, wherein the third SVP is configured to modify a header of a packet containing the data before transmitting the data to the first SVP.

6. The apparatus of claim 1, wherein the first SVP comprises a flow processor and a vector processor communicatively coupled to the flow processor, and wherein the flow processor is configured to control an execution flow of the vector processor.

7. The apparatus of claim 6, wherein the flow processor and the vector processor are synchronous.

8. The apparatus of claim 1, wherein the second SVP is further configured to transmit control information to the first SVP, and wherein the first SVP is further configured to use the control information to resolve a control branch.

9. The apparatus of claim 1, wherein the data comprises at least one of value data used by the first SVP as input to an instruction or control information used by the first SVP to break sequential execution of an instruction flow of the first SVP.

10. The apparatus of claim 1, wherein the first SVP and the second SVP are arranged on a same functional simulation acceleration (FSA) system board.

11. The apparatus of claim 1, wherein the first SVP is arranged on a first FSA system board and the second SVP is arranged on a second FSA system board, and wherein the first FSA system board and the second FSA system board are assembled on a same chassis.

12. A method for simulating circuit designs, the method comprising:
simulating, by a first simulation vector processor (SVP), a first portion of a circuit design under test;
simulating, by a second SVP communicatively coupled to the first SVP, the first portion of the circuit design under test at least partially while the first SVP simulates the first portion of the circuit design and asynchronously with the first SVP;
transmitting, by the second SVP, data to the first SVP while simulating the first portion of the circuit design; and
using, by the first SVP, the data while simulating the first portion of the circuit design.

13. The method of claim 12, wherein the data is first transmitted from the second SVP to a third SVP and then transmitted from the third SVP to the first SVP.

14. The method of claim 13, further comprising, determining, by the second SVP and based on a data structure stored by the second SVP, that the data should be first transmitted from the second SVP to the third SVP, wherein the data structure indicates a route from the second SVP to the first SVP, and wherein the route comprises the third SVP.

15. The method of claim 13, wherein the data is first transmitted from the second SVP to the third SVP in response to an instruction to transmit the data from the second SVP to the first SVP.

16. The method of claim 13, further comprising modifying, by the third SVP, a header of a packet containing the data before transmitting the data to the first SVP.

17. The method of claim 12, wherein the first SVP comprises a flow processor and a vector processor communicatively coupled to the flow processor, and wherein the flow processor is configured to control an execution flow of the vector processor.

18. The method of claim 12, further comprising:
transmitting, by the second SVP, control information to the first SVP; and
using, by the first SVP, the control information to resolve a control branch.

19. The method of claim 12, wherein the data comprises at least one of value data used by the first SVP as input to an instruction or control information used by the first SVP to break sequential execution of an instruction flow of the first SVP.

20. A non-transitory computer readable medium storing instructions for simulating circuit designs that, when executed by a first SVP, cause the first SVP to perform an operation for simulating circuit designs, the operation comprising:
simulating a first portion of a circuit design under test, wherein a second SVP communicatively coupled to the first SVP simulates the first portion of the circuit design under test at least partially while the first SVP simulates the first portion of the circuit design and asynchronously with the first SVP;
receiving data from the second SVP while simulating the first portion of the circuit design; and
using the data while simulating the first portion of the circuit design.

* * * * *